(12) United States Patent
Tokita et al.

(10) Patent No.: US 8,131,158 B2
(45) Date of Patent: Mar. 6, 2012

(54) OPTICAL TRANSMISSION CIRCUIT

(75) Inventors: Shigeru Tokita, Yokohama (JP); Hiroo Matsue, Yokohama (JP); Akira Kuwahara, Fujisawa (JP)

(73) Assignee: Opnext Japan, Inc., Kanagawa (JP)

( * ) Notice: Subject to any disclaimer, the term of this patent is extended or adjusted under 35 U.S.C. 154(b) by 500 days.

(21) Appl. No.: 12/360,147

(22) Filed: Jan. 27, 2009

(65) Prior Publication Data

US 2009/0245812 A1 Oct. 1, 2009

(30) Foreign Application Priority Data

Mar. 28, 2008 (JP) .................. 2008-086446

(51) Int. Cl.
*H04B 10/04* (2006.01)

(52) U.S. Cl. ......... 398/194; 398/192; 398/187; 398/182

(58) Field of Classification Search .................. 398/194, 398/192, 187, 182
See application file for complete search history.

(56) References Cited

U.S. PATENT DOCUMENTS

| 6,091,025 A * | 7/2000 | Cotter et al. ............. 174/110 R |
| 6,684,030 B1 * | 1/2004 | Taylor et al. .................. 398/59 |
| 2004/0114650 A1 | 6/2004 | Tanaka et al. |

FOREIGN PATENT DOCUMENTS

| JP | 2002-185408 A | 6/2002 |
| JP | 2002-299648 A | 10/2002 |
| JP | 2004-193489 | 7/2004 |
| JP | 2004-241480 A | 8/2004 |
| JP | 2008-060484 A | 3/2008 |

* cited by examiner

*Primary Examiner* — Kinam Park
(74) *Attorney, Agent, or Firm* — Antonelli, Terry, Stout & Kraus, LLP.

(57) ABSTRACT

Provided is an optical transmission circuit capable of realizing a high-quality optical signal waveform with low power consumption. An optical transmission circuit (10) includes: a laser diode (800); a modulator (900) for supplying a differential modulation current to an anode terminal and a cathode terminal of the laser diode (800) through transmission lines (301 to 304); a current source (101) for supplying a forward bias current to the laser diode (800); and a magnetic sheet (wave absorber) (400) disposed so as to cover at least a part of the transmission lines (303 and 304). An impedance of the laser diode (800) is lower than characteristic impedances of the transmission lines (301 to 304) which are formed so that the characteristic impedances thereof are matched to an output impedance of the modulator (900).

12 Claims, 5 Drawing Sheets

PRIOR ART

FIG.7

OPTICAL TRANSMISSION CIRCUIT

CROSS-REFERENCE TO RELATED APPLICATION

The present application claims priority from Japanese application JP 2008-086446 filed on Mar. 28, 2008, the content of which is hereby incorporated by reference into this application.

BACKGROUND OF THE INVENTION

1. Field of the Invention

The present invention relates to an optical transmission circuit, and more particularly, to a circuit system of a laser diode drive circuit for an optical communication system.

2. Description of the Related Art

Conventionally, there has been known an optical transmission circuit which drives a light emitting device by a differential modulator (for example, see JP 2004-193489 A).

Figure 5:
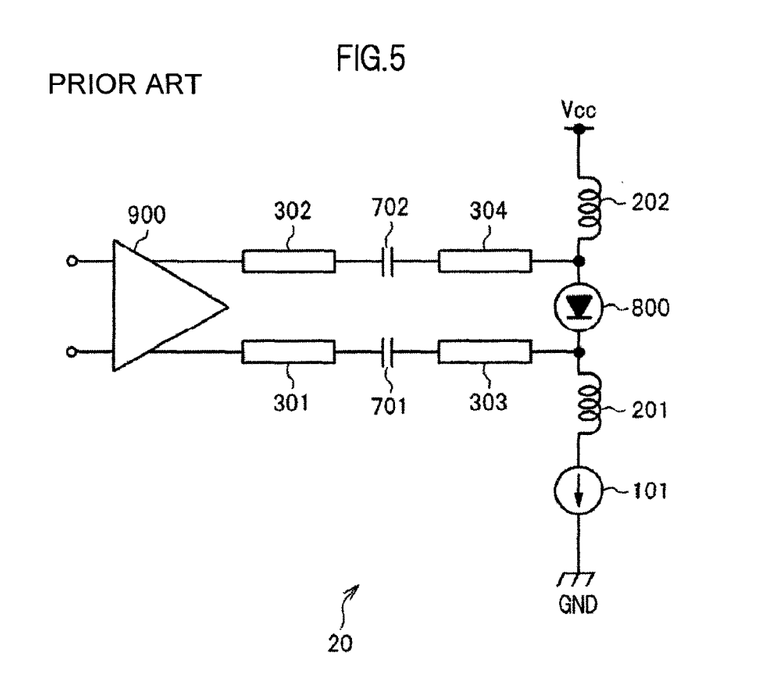
FIG. 5 is a circuit diagram illustrating an example of the conventional optical transmission circuit.

FIG. 5 is a circuit diagram illustrating an example of such a conventional optical transmission circuit 20. As illustrated in FIG. 5, the optical transmission circuit 20 includes a laser diode 800, a modulator 900, and a current source 101. The modulator 900 supplies a differential modulation current to the laser diode 800 through transmission lines 301, 302, 303, and 304, and AC coupling capacitors 701 and 702. The current source 101 supplies a bias current to the laser diode 800 through inductors 201 and 202.

In the conventional optical transmission circuit 20 illustrated in FIG. 5, the inductors 201 and 202 provided at a cathode terminal and an anode terminal of the laser diode 800, respectively, are formed to have a high impedance with respect to an AC signal such as a modulation current. Accordingly, leakage of a modulation current to the current source 101, a ground line, and a power supply line is suppressed by the inductors 201 and 202, whereby the differential modulation current efficiently flows through the laser diode 800.

As a specific device of the current source 101, a bipolar transistor or a field effect transistor is used. As the inductors 201 and 202, a chip inductor or a chip bead of several μH to several tens μH is used in some cases by taking a mounting area or permissible rated current into consideration.

Characteristic impedances of the transmission lines 301, 302, 303, and 304 are set to approximately 25Ω to 50Ω so as to achieve matching with an output impedance of the modulator 900.

Figure 6:
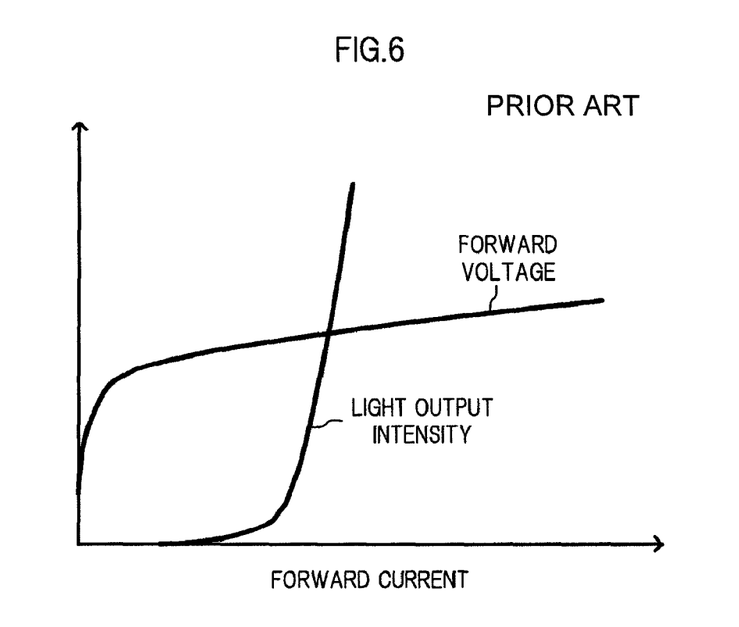
FIG. 6 is a graph illustrating an example of a forward voltage and a light output intensity with respect to a forward current of a laser diode.

FIG. 6 is a graph illustrating an example of a forward voltage and a light output intensity with respect to a forward current of the laser diode 800. As illustrated in FIG. 6, in the laser diode 800, the light output intensity and the forward voltage increase as the forward current increases. A bias current of about several tens mA is supplied when the laser diode 800 is operated, and on this occasion, an impedance of the laser diode 800, which is obtained by a slope of the forward current and a slope of the forward voltage, is approximately several Ω to a dozen or so of Ω, which is smaller compared with the transmission lines 301, 302, 303, and 304.

For this reason, impedance mismatch occurs at a connection point between the transmission line 303 and the laser diode 800 and a connection point between the transmission line 304 and the laser diode 800, and hence, in some cases, a part of a high-frequency signal is not transmitted to the laser diode 800 to return to the modulator 900 as a reflected wave. In addition, though slightly, impedance mismatch actually exists at a connection point between the modulator 900 and the transmission line 301 and a connection point between the modulator 900 and the transmission line 302, and hence, in some cases, a part of the reflected wave returning to the modulator 900 is further reflected at the connection point between the modulator 900 and the transmission line 301 and the connection point between the modulator 900 and the transmission line 302. In other words, reflection is generated at both ends of the transmission line, which are impedance mismatch points, and accordingly, a resonance phenomenon occurs in some cases. A multiple reflected wave which generates such a resonance phenomenon is superimposed on an electric signal supplied to the laser diode 800 as high-frequency noise, whereby the high-frequency noise is also superimposed on an optical signal generated by the laser diode 800.

In order to solve a problem of the impedance mismatch, there is a technique of reducing the characteristic impedances of the transmission lines 301, 302, 303, and 304 and the output impedance of the modulator 900 to approximately several Ω to a dozen or so of Ω, which is the impedance of the laser diode 800. However, in order to ensure a voltage amplitude required to drive the laser diode 800 in the state in which the output impedance of the modulator 900 is reduced to approximately several Ω to a dozen or so of Ω, there arises another problem that power consumption of the modulator 900 increases. Hereinafter, the reason why the power consumption of the modulator 900 increases is described.

Figure 7:
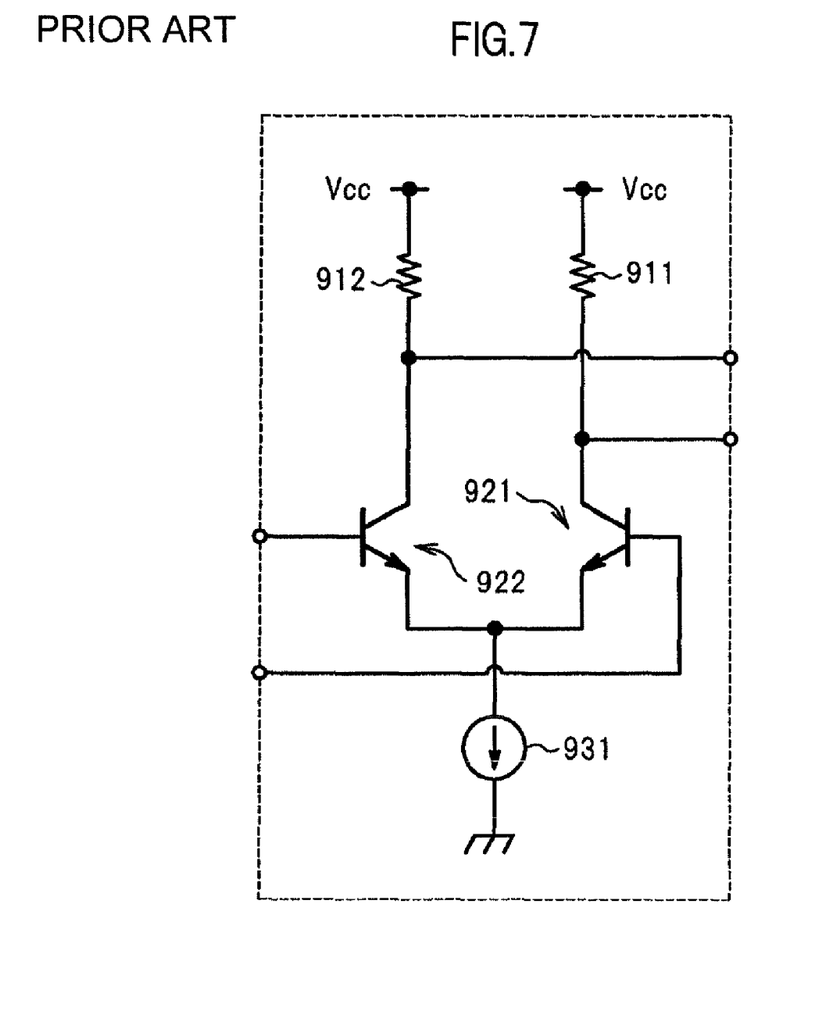
FIG. 7 is a circuit diagram illustrating a typical circuit configuration example of a modulator.

FIG. 7 is a circuit diagram illustrating a typical circuit configuration example of the modulator 900. The modulator 900 illustrated in FIG. 7 includes a current source 931, transistors 921 and 922 which have emitter terminals connected to each other to form a differential current switch, and output resistors 911 and 912.

As illustrated in FIG. 7, when a differential voltage signal is applied to base terminals of the transistors 921 and 922, one of the transistors 921 and 922 which form the differential current switch is in an on state, and another thereof is in an off state, whereby a current supplied from the current source 931 selectively flows through any one of the output resistor 911 and the output resistor 912. Further, a voltage amplitude for driving the laser diode 800 is determined by a product of resistance values of the output resistors 911 and 912 and values of currents flowing through the output resistors 911 and 912 (current amount of the current source 931).

Here, in order to reduce the output impedance of the modulator 900 to approximately several Ω to a dozen or so of Ω which is an impedance of the laser diode 800, the resistance values of the output resistors 911 and 912 each need to be set to approximately several Ω to a dozen or so of Ω. However, the voltage amplitude required for driving the laser diode 800 cannot be obtained by such low output resistance values, and thus the current of the current source 931 needs to be increased so as to compensate for a decrease in output resistance.

As described above, when the output impedance of the modulator 900 is reduced to approximately several Ω to a dozen or so of Ω which is the impedance of the laser diode 800, impedance mismatch is resolved. However, there arises another problem that power consumption of the modulator 900 increases. In other words, it is difficult to make both an increase in quality of the optical signal waveform and a decrease in power consumption coexist by the technique of matching the output impedance of the modulator 900 to the impedance of the laser diode 800.

SUMMARY OF THE INVENTION

The present invention has been made in view of the above-mentioned conventional problems, and therefore an object thereof is to provide an optical transmission circuit capable of realizing a high-quality optical signal waveform with low power consumption.

In order to solve the above-mentioned problems, an optical transmission circuit according to the present invention includes: a light emitting device; a modulator for supplying a differential modulation current to an anode and a cathode of the light emitting device through a first transmission line and a second transmission line; a current source for supplying a forward bias current to the light emitting device; and a wave absorber disposed so as to cover at least a part of the first transmission line and the second transmission line, in which an impedance of the light emitting device is lower than a characteristic impedance of the first transmission line and a characteristic impedance of the second transmission line, the first transmission line and the second transmission line being formed so that the characteristic impedances thereof are matched to an output impedance of the modulator.

The wave absorber disposed so as to cover at least a part of the transmission lines functions of reducing an electromagnetic field formed in the vicinity of the transmission lines along with transmission of a high-frequency signal. For this reason, according to the present invention, a reflected wave of the differential modulation current, which is generated due to mismatching between the impedance of the light emitting device and the characteristic impedances of the first transmission line and the second transmission line, is reduced, with the result that a high-quality optical signal waveform can be realized. Moreover, it is not required to match the output impedance of the modulator to the impedance of the light emitting device, and hence an increase in power consumption of the modulator can be prevented.

Further, in one aspect of the present invention, the wave absorber is formed of a material in which a wave absorptivity on a high-frequency side with respect to a fundamental frequency of the differential modulation current is higher than a wave absorptivity at the fundamental frequency. According to this aspect, a standing wave which is generated due to multiple reflection of the differential modulation current can be reduced while preventing a decrease in differential modulation current. That is, the reflected wave of the differential modulation current, which is generated due to impedance mismatch, can be preferably reduced.

Further, in one aspect of the present invention, the wave absorber is formed of a material in which an imaginary part of a permeability on the high-frequency side with respect to the fundamental frequency of the differential modulation current is larger than an imaginary part of a permeability at the fundamental frequency. The imaginary part of the permeability is a component which contributes to absorption of a radio wave (loss of an electromagnetic field), and therefore, according to this aspect, the reflected wave of the differential modulation current, which is generated due to impedance mismatch, can be preferably reduced.

Further, in one aspect of the present invention, the wave absorber is formed of a material having a relative permittivity larger than one. According to this aspect, there are increases in electric flux density and magnetic flux density in the wave absorber related to the electric field generated in the vicinity of the transmission lines along with transmission of the high-frequency signal. Therefore, the reflected wave of the differential modulation current, which is generated due to impedance mismatch, can be preferably reduced.

Further, in one aspect of the present invention, a part of the first transmission line and the second transmission line is formed on a flexible substrate, and the wave absorber is sheet-like and is disposed so as to cover at least a part of the transmission line formed on the flexible substrate. According to this aspect, even when a part of the first transmission line and the second transmission line is formed on the flexible substrate, the reflected wave of the differential modulation current, which is generated due to impedance mismatch, can be preferably reduced without impairing flexibility of the flexible substrate.

Further, in one aspect of the present invention, a length of a range where the transmission line is covered by the wave absorber is determined based on the wave absorptivity of the wave absorber at the fundamental frequency. According to this aspect, a shape of the wave absorber can be determined so as to optimize a balance between a permissible reduction amount of the differential modulation current and a desired reduction amount of the standing wave generated due to multiple reflection of the differential modulation current.

Further, in one aspect of the present invention, the wave absorber is formed of a magnetic material.

It should be noted that, in each of the above-mentioned aspects, the cathode of the light emitting device may be connected to a ground line through the current source. Further, the optical transmission circuit may further include a first inductor connected between the cathode of the light emitting device and a ground line, or may further include a second inductor connected between the anode of the light emitting device and a power supply line. Further, the optical transmission circuit may further include AC coupling devices each inserted into the first transmission line and the second transmission line which connect the light emitting device and the modulator.

According to the present invention, there can be reduced a reflected wave of the differential modulation current, which is generated due to mismatching between the impedance of the light emitting device and the characteristic impedances of the first transmission line and the second transmission line, whereby a high-quality optical signal waveform can be realized. Further, it is not required to match the output impedance of the modulator to the impedance of the light emitting device, whereby an increase in power consumption of the modulator can be prevented.

DETAILED DESCRIPTION OF THE INVENTION

Hereinafter, an embodiment of the present invention is described with reference to the drawings.

Figure 1:
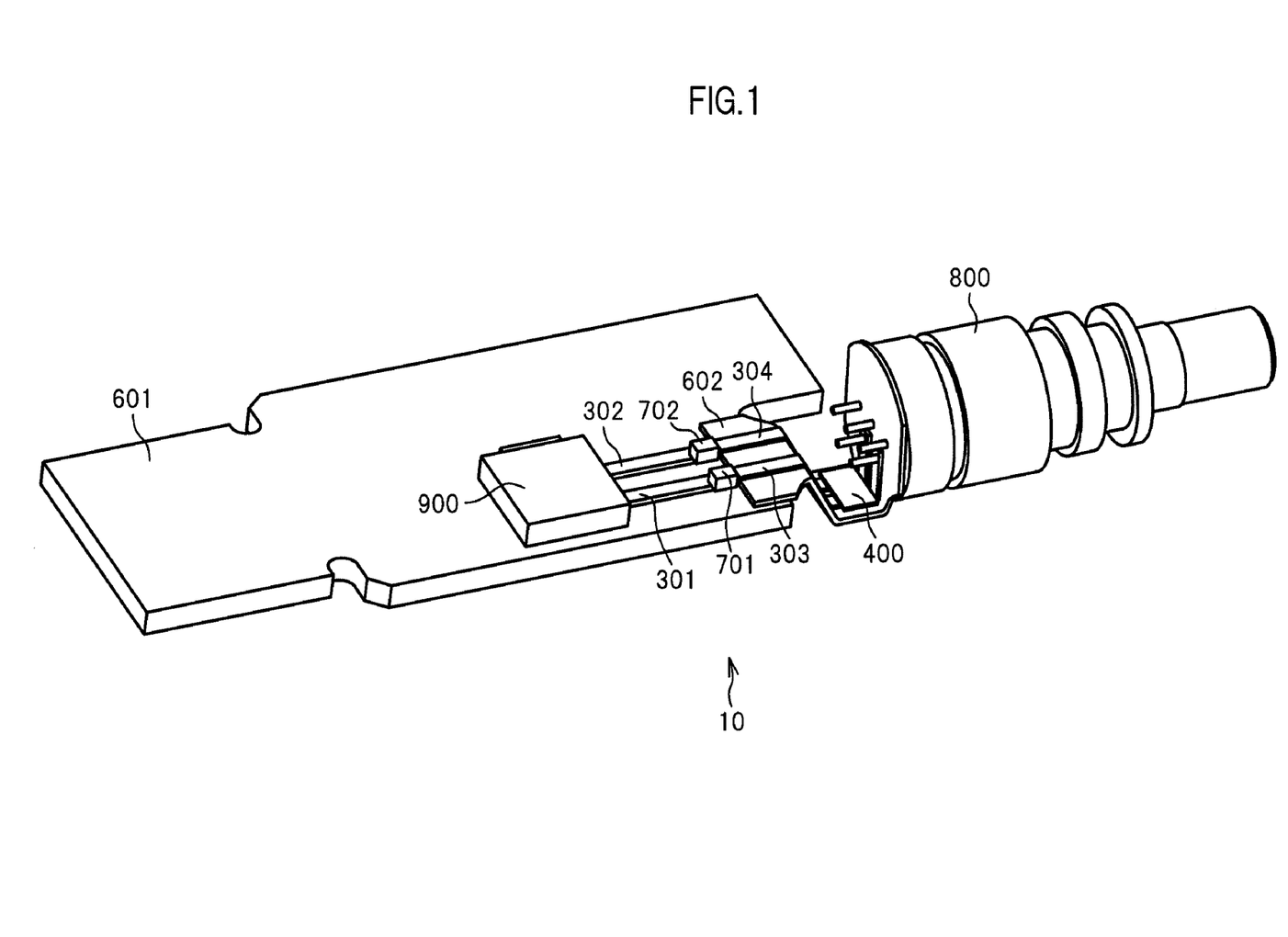
FIG. 1 is an external view of an optical transmission circuit according to an embodiment of the present invention.
Figure 2:
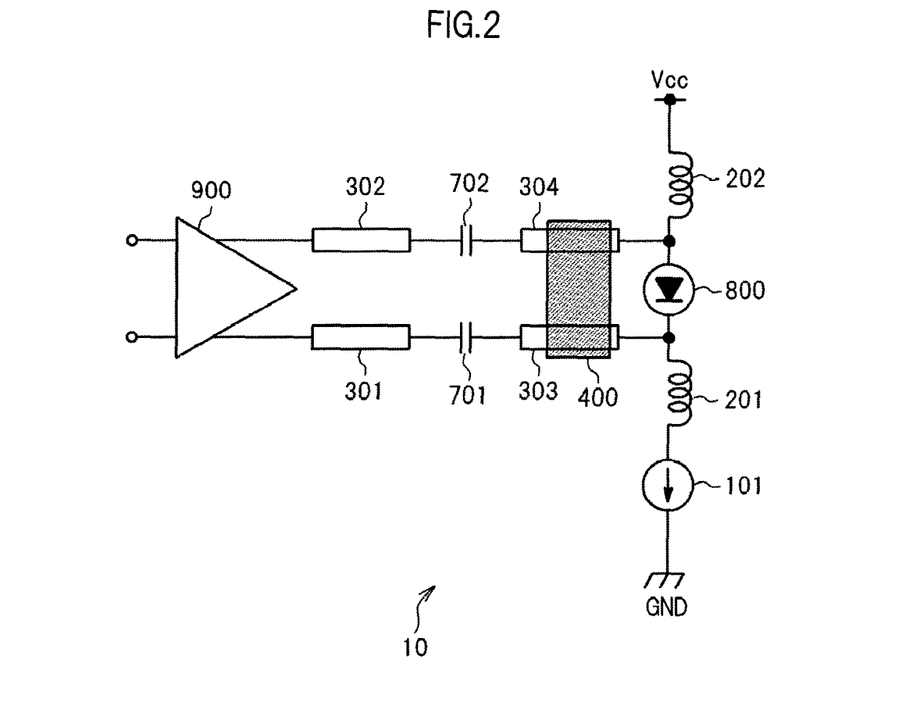
FIG. 2 is a circuit diagram of the optical transmission circuit according to the embodiment of the present invention.

FIG. 1 is an external view of an optical transmission circuit 10 according to the embodiment of the present invention. FIG. 2 is a circuit diagram of the optical transmission circuit 10.

As illustrated in FIG. 1 and FIG. 2, the optical transmission circuit 10 includes a laser diode 800, a modulator 900, an inductor 201 connected to a cathode terminal of the laser diode 800, a current source 101 connected between the inductor 201 and a ground line, an inductor 202 connected between an anode terminal of the laser diode 800 and a power supply line, and a magnetic sheet 400 disposed on a part or an entire of transmission lines 303 and 304 as one of wave absorbers. The modulator 900 supplies a differential modulation current to the laser diode 800 through transmission lines 301 and 302, AC coupling capacitors 701 and 702, and the transmission lines 303 and 304.

The modulator 900 is mounted on a glass epoxy substrate 601, and differential output terminals thereof for outputting a positive-phase modulation current and a negative-phase modulation current are connected to the transmission lines 301 and 302, respectively. As described above (see FIG. 7), the modulator 900 outputs a differential modulation current in response to a differential voltage signal (high level or low level) applied to an input terminal of the modulator 900, and modulates an intensity of an optical signal generated by the laser diode 800 to a high or low level. It should be noted that, in this embodiment, it is assumed that a fundamental frequency of the differential modulation current is 5 GHz, and that respective output resistances in the modulator 900 are set to approximately 50Ω.

The transmission lines 301 and 302 are differential transmission lines formed on the glass epoxy substrate 601 which has a ground plane and form a microstrip line between the ground plane and themselves. The transmission lines 303 and 304 are differential transmission lines formed on a flexible substrate 602 which has a ground plane and form a microstrip line between the ground plane and themselves. In the vicinity of the transmission lines 301, 302, 303, and 304 which transmit a high-frequency signal such as the differential modulation current, a high-frequency electromagnetic field corresponding to a fluctuation in the high-frequency signal is formed. It should be noted that, as to a type of the transmission lines 301, 302, 303, and 304, a transmission line such as a coplanar line other than a microstrip line may be used.

In this embodiment, line widths of the transmission lines 301, 302, 303, and 304 is designed so that the characteristic impedances thereof become substantially equal to the output impedance of the modulator 900.

The current source 101 supplies a forward bias current of about several tens of mA to the laser diode 800. The inductors 201 and 202 connected to both ends of the laser diode 800 are provided so that the current source 101 can supply the forward bias current to the laser diode 800 without inhibiting the differential modulation current supplied from the modulator 900 to the laser diode 800. Further, the AC coupling capacitors 701 and 702 inserted between the transmission lines 301 and 303 and between the transmission lines 302 and 304, respectively, are provided to prevent a drive voltage of the modulator 900 from being insufficient due to a voltage drop generated by the bias current supplied to the laser diode 800.

The laser diode 800 is supplied with the forward bias current from the current source 101. In addition, the laser diode 800 is supplied with the differential modulation current by the modulator 900.

An impedance of the laser diode 800 is approximately several Ω to a dozen or so of Ω, and is lower than the characteristic impedances of the transmission lines 303 and 304 connected to the cathode terminal and the anode terminal of the laser diode 800, respectively. For this reason, impedance mismatch exists at a connection point between the laser diode 800 and the transmission line 303 and a connection point between the laser diode 800 and the transmission line 304, whereby a reflected wave of a high-frequency signal (differential modulation current) is generated at those connection points. As described above, though slightly, impedance mismatch actually exists at a connection point between the modulator 900 and the transmission line 301 and a connection point between the modulator 900 and the transmission line 302, and hence a part of the reflected wave returning to the modulator 900 is further reflected at the connection point between the modulator 900 and the transmission line 301 and the connection point between the modulator 900 and the transmission line 302. In other words, reflection is generated at both ends of the transmission lines, which are impedance mismatch points, with the result that a standing wave is generated.

In this embodiment, the magnetic sheet 400 which is one of wave absorbers is bonded to the transmission lines 303 and 304 so as to cover a part or entire of the transmission lines 303 and 304, respectively, whereby the standing wave is lost. Accordingly, reflected waves of the high-frequency signals traveling from the connection point between the laser diode 800 and the transmission line 303 and the connection point between the laser diode 800 and the transmission line 304 toward the modulator 900 are reduced. Hereinafter, the reason why the magnetic sheet 400 reduces the reflected wave of the high-frequency signal is described.

Figure 3:
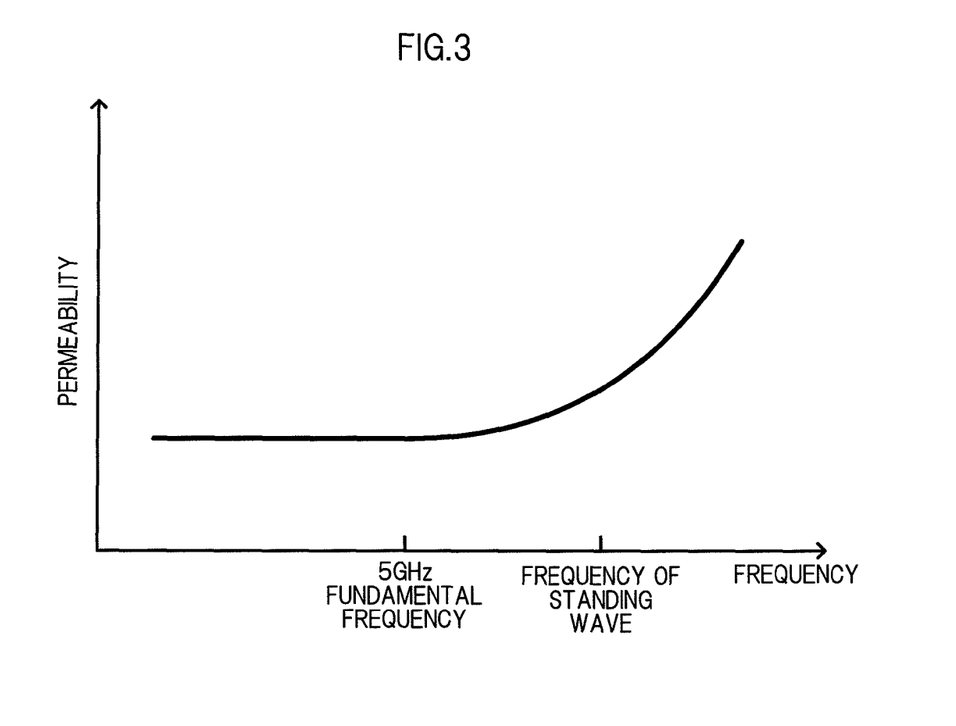
FIG. 3 is a graph illustrating an example of permeability characteristics (imaginary part) of a magnetic sheet.

FIG. 3 is a graph illustrating an example of permeability characteristics of the magnetic sheet 400, in which a vertical axis represents an imaginary part of a permeability (complex permeability) and a horizontal axis represents a frequency. The imaginary part of the permeability is a component which contributes to absorption of a radio wave, that is, loss of an electromagnetic field. As illustrated in FIG. 3, the magnetic sheet 400 is made of a material having a larger imaginary part of the permeability at the frequency of the above-mentioned standing wave present on the high-frequency side with respect to the fundamental frequency 5 GHz of the differential modulation current than the imaginary part of the permeability at 5 GHz. For this reason, the magnetic sheet 400 disposed on the transmission lines 303 and 304 can lose considerably, among the electromagnetic field formed in the vicinity of the transmission lines 303 and 304 which transmit a high-frequency signal, only the electromagnetic field at a frequency larger than 5 GHz while suppressing loss of the electromagnetic field of a 5 GHz band related to the differential modulation current. The electromagnetic field at the frequency larger than 5 GHz contains the electromagnetic field related to the above-mentioned standing wave, and hence a part of a reflected wave of the high-frequency signal is absorbed by the magnetic sheet 400 bonded to the transmission lines 303 and 304.

Further, in this embodiment, the transmission lines 303 and 304 are formed on the flexible substrate 602 for improving degree of freedom in mounting. For this reason, the magnetic sheet 400 bonded to the transmission lines 303 and 304 desirably has a small thickness so as not to impair flexibility of the flexible substrate 602. In this case, it is effective to adopt, for the magnetic sheet 400, a material satisfying the condition that a relative permittivity is larger than one in addition to the above-mentioned condition that the imaginary part of the permeability on the high-frequency side with respect to the fundamental frequency of the differential modulation current is large. This is because, when the relative permittivity of the magnetic sheet 400 is larger than one, the electromagnetic field formed in the vicinity of the transmission lines can be confined inside the thin magnetic sheet 400 as much as possible, to thereby be efficiently lost.

It should be noted that a length of a range where transmission lines 303 and 304 are covered by the magnetic sheet 400 may be determined based on a wave absorptivity of the magnetic sheet 400 (for example, imaginary part of the permeability illustrated in FIG. 3) at the fundamental frequency of the differential modulation current.

Here, there are described effects in the case of applying the magnetic sheet 400 formed of a material having a characteristic in which a real part and an imaginary part of a relative permeability are 1.2 and 1.6, respectively, and a real part and an imaginary part of the relative permittivity are 26.8 and 2.3, respectively.

Figure 4A:
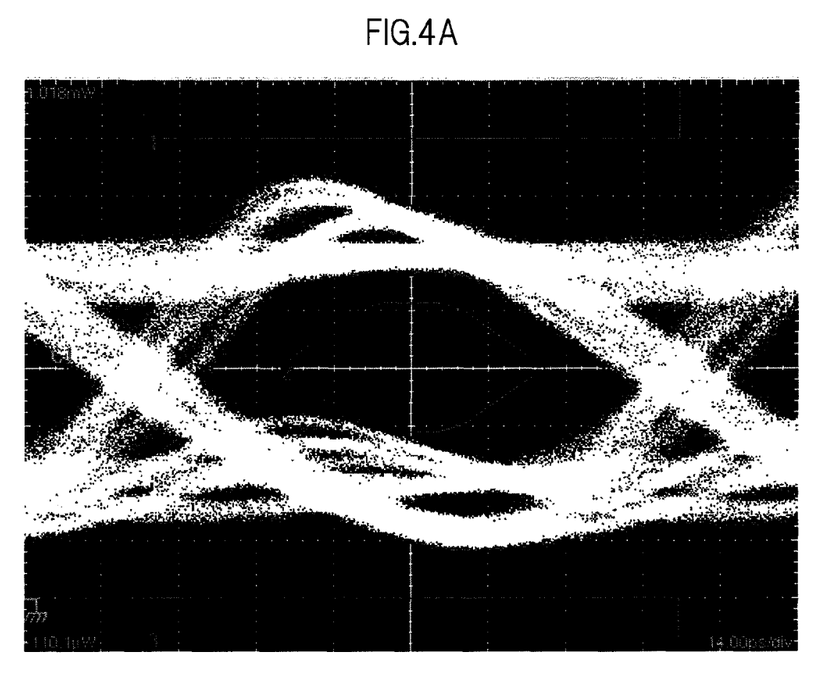
FIG. 4A is a view illustrating an example of an observation result of an optical transmission waveform provided by a conventional optical transmission circuit.
Figure 4B:
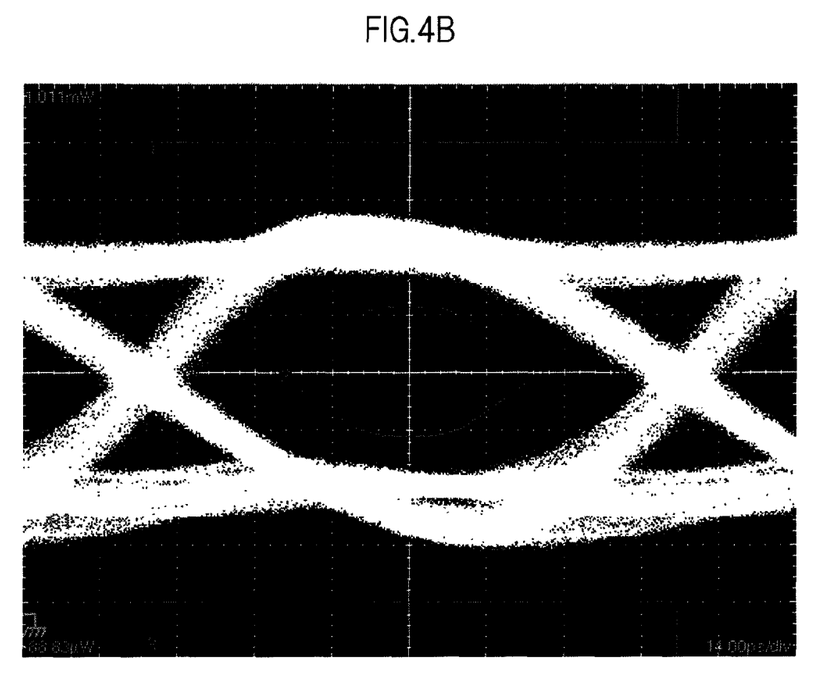
FIG. 4B is a view illustrating an example of an observation result of an optical transmission waveform provided by the optical transmission circuit according to the embodiment of the present invention.

FIG. 4A illustrates an example of an observation result on an optical signal waveform obtained by a conventional optical transmission circuit 20 in which the magnetic sheet 400 is not provided on the transmission line. FIG. 4B illustrates an example of an observation result on an optical signal waveform obtained by the optical transmission circuit 10 according to this embodiment, in which the magnetic sheet 400 is provided on the transmission lines 303 and 304. In those examples, the optical transmission circuits 10 and 20 are each supplied with a pseudo random data signal, and a sampling oscilloscope is caused to superimpose a waveform of an optical signal output from the laser diode 800 thereon in units of data signal periods for rendering. A horizontal axis represents a time, and a vertical axis represents an optical signal intensity. It is shown that, as an opening rendered on the screen becomes larger, a difference between a high-level optical signal and a low-level optical signal becomes larger (it is easier to distinguish between a high level and a low level), that is, quality of the optical signal is higher.

There exist a plurality of bright lines in the optical signal waveform of the optical transmission circuit 20, which is illustrated in FIG. 4A, and the optical signal waveform is displayed to appear blurred in both a time axis direction and an optical signal intensity direction. This is because the magnetic sheet 400 is not provided on the transmission line, and hence a multiple reflected wave is combined to be superimposed on the optical signal as high-frequency noise. Contrary to this, the number of the bright lines is suppressed in the optical signal waveform of the optical transmission circuit 10, which is illustrated in FIG. 4B, and there is displayed an excellent waveform having large opening while being less blurred in both the time axis direction and the optical signal intensity direction. This is because the magnetic sheet 400 is bonded to the transmission lines 303 and 304, and hence the multiple reflected wave which becomes a cause of high-frequency noise is reduced.

According to the optical transmission circuit 10 described above, the magnetic sheet 400 disposed on the transmission lines 303 and 304 formed on the flexible substrate 602 reduces a reflected wave of a differential modulation current generated due to mismatching between the impedance of the laser diode 800 and the characteristic impedances of the transmission lines 303 and 304 formed on the flexible substrate 602, with the result that a high-quality optical signal waveform can be realized. Further, there is no need to match the output impedance of the modulator 900 to the impedance of the laser diode 800, and hence an increase in power consumption of the modulator 900 can be prevented.

It should be noted that the present invention is not limited to the embodiment described above. That is, the present invention is widely applicable to an optical transmission circuit including a light emitting device, a modulator for supplying a differential modulation current to an anode and a cathode of the light emitting device through a differential transmission line, and a current source for supplying a forward bias current to the light emitting device. Further, the wave absorber according to the present invention is made of any material as long as it has a high wave absorptivity in a high-frequency band.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical transmission circuit, comprising:
   a light emitting device;
   a modulator for supplying a differential modulation current to an anode and a cathode of the light emitting device through a first transmission line and a second transmission line;
   a current source for supplying a forward bias current to the light emitting device; and
   a wave absorber for reducing a reflected wave of the differential modulation current, the wave absorber being sheet-like and disposed so as to cover at least a part of the first transmission line and the second transmission line,
   wherein an impedance of the light emitting device is lower than a characteristic impedance of the first transmission line and a characteristic impedance of the second transmission line, the first transmission line and the second transmission line being formed so that the characteristic impedances thereof are matched to an output impedance of the modulator.

2. An optical transmission circuit according to claim 1, wherein the wave absorber is formed of a material in which a wave absorptivity on a high-frequency side with respect to a fundamental frequency of the differential modulation current is higher than a wave absorptivity at the fundamental frequency.

3. An optical transmission circuit according to claim 2, wherein the wave absorber is formed of a material in which an imaginary part of a permeability on the high-frequency side with respect to the fundamental frequency of the differential modulation current is larger than an imaginary part of a permeability at the fundamental frequency.

4. An optical transmission circuit according to claim 1, wherein the wave absorber is formed of a material having a relative permittivity larger than one.

5. An optical transmission circuit according to claim 1, wherein:
   the part of the first transmission line and the second transmission line is formed on a flexible substrate; and
   the wave absorber is disposed so as to cover at least the part of the transmission line formed on the flexible substrate.

6. An optical transmission circuit according to claim 2, wherein a length of a range where the transmission line is covered by the wave absorber is determined based on the wave absorptivity of the wave absorber at the fundamental frequency.

7. An optical transmission circuit according to claim 1, wherein the wave absorber is formed of a magnetic material.

8. An optical transmission circuit according to claim 1, wherein the cathode of the light emitting device is connected to a ground line through the current source.

9. An optical transmission circuit according to claim 1, further comprising a first inductor connected between the cathode of the light emitting device and a ground line.

10. An optical transmission circuit according to claim 1, further comprising a second inductor connected between the anode of the light emitting device and a power supply line.

11. An optical transmission circuit according to claim 1, further comprising AC coupling devices each inserted into the first transmission line and the second transmission line which connect the light emitting device and the modulator.

12. An optical transmission circuit according to claim 1, further comprising at least one additional wave-absorber covering at least a different part of the first transmission line and the second transmission line.

\* \* \* \* \*